United States Patent
Yang et al.

(10) Patent No.: US 7,687,153 B2
(45) Date of Patent: Mar. 30, 2010

(54) DONOR SUBSTRATE FOR LASER TRANSFER AND ORGANIC ELECTROLUMINESCENCE DISPLAY DEVICE MANUFACTURED USING THE SAME

(75) Inventors: Nam-Choul Yang, Suwon-si (KR);
Seong-Taek Lee, Suwon-si (KR);
Min-Chul Suh, Suwon-si (KR);
Tae-Min Kang, Suwon-si (KR);
Mu-Hyun Kim, Suwon-si (KR);
Byung-Doo Chin, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 703 days.

(21) Appl. No.: 10/984,762

(22) Filed: Nov. 10, 2004

(65) Prior Publication Data
US 2005/0123801 A1    Jun. 9, 2005

(30) Foreign Application Priority Data
Nov. 29, 2003  (KR) ............... 10-2003-0086136

(51) Int. Cl.
*H01J 1/62* (2006.01)
*H01L 51/00* (2006.01)
*H01L 29/20* (2006.01)
*B05D 5/12* (2006.01)

(52) U.S. Cl. ............... 428/690; 428/917; 313/503; 313/504; 313/506; 257/40; 257/89; 257/90; 257/102; 257/103; 427/66

(58) Field of Classification Search ............... 428/690, 428/917, 913; 313/504, 506; 257/88, 89
See application file for complete search history.

(56) References Cited

U.S. PATENT DOCUMENTS 5,220,348 A    6/1993  D'Aurelio ............... 347/236

(Continued)

FOREIGN PATENT DOCUMENTS

JP    2000-056707    2/2000

(Continued)

OTHER PUBLICATIONS

Korean Office action corresponding to Korean Patent Application No. 10-2003-0086136, issued on Mar. 30, 2006.

(Continued)

*Primary Examiner*—D. Lawrence Tarazano
*Assistant Examiner*—Carrie S Thompson
(74) *Attorney, Agent, or Firm*—Robert E. Bushnell, Esq.

(57) ABSTRACT

A donor substrate for laser transfer comprises: a base film; a light-to-heat conversion layer formed on the base film; and a transfer layer formed of an organic material on the light-to-heat conversion layer. The transfer layer contains a thermosetting electroluminescent material, and an organic electroluminescence display device is manufactured using the same. Thus, R, G and B emission layers are simply formed with a fine pattern by a thermal curing process after laser transfer. As a result, the emission layers are not damaged, and the manufacturing cost of a full-color organic electroluminescence display device is reduced due to employment of a simplified mask process. The donor substrate is advantageous to use in the manufacture of a large-sized organic electroluminescence display device.

12 Claims, 3 Drawing Sheets

U.S. PATENT DOCUMENTS

| | | | | |
|---|---|---|---|---|
| 5,256,506 | A | | 10/1993 | Ellis et al. ............... 430/20 |
| 5,278,023 | A | | 1/1994 | Bills et al. ............. 430/201 |
| 5,308,737 | A | | 5/1994 | Bills et al. ............. 430/201 |
| 5,688,551 | A | | 11/1997 | Littman et al. ........... 427/64 |
| 5,937,272 | A | * | 8/1999 | Tang ..................... 438/30 |
| 5,998,085 | A | | 12/1999 | Isberg et al. ........... 430/200 |
| 6,114,088 | A | * | 9/2000 | Wolk et al. ........... 430/273.1 |
| 6,214,520 | B1 | | 4/2001 | Wolk et al. ........... 430/273.1 |
| 6,242,152 | B1 | | 6/2001 | Staral et al. |

FOREIGN PATENT DOCUMENTS

| | | |
|---|---|---|
| JP | 2000-286060 | 10/2000 |
| JP | 2003-308976 | 10/2003 |
| KR | 10-0195175 | 2/1999 |
| KR | 2000-34508 | 6/2000 |
| KR | 2002-0025840 | 4/2002 |
| WO | WO 03/017732 | 2/2003 |

OTHER PUBLICATIONS

Office action from the Japanese Patent Office issued in Applicant's corresponding Japanese Patent Application No. 2004-342149 dated Dec. 18, 2007.

Office action from Japanese Patent Office issued in Applicant's corresponding Japanese Patent Application No. 2004-342149 dated May 19, 2009 and Request for Entry of the Accompanying Office Action.

* cited by examiner

DONOR SUBSTRATE FOR LASER TRANSFER AND ORGANIC ELECTROLUMINESCENCE DISPLAY DEVICE MANUFACTURED USING THE SAME

CLAIM OF PRIORITY

This application makes reference to, incorporates the same herein, and claims all benefits accruing under 35 U.S.C. §119 from an application entitled DONOR FILM FOR LASER INDUCED THERMAL IMAGING METHOD AND ELECTROLUMINESCENCE DISPLAY DEVICE MANUFACTURED USING THE SAME FILM filed with the Korean Intellectual Property Office on 29 Nov. 2003, and there duly assigned Serial No. 2003-86136.

BACKGROUND OF THE INVENTION

1. Technical Field

The present invention relates to a donor substrate for laser transfer and an organic electroluminescence display device manufactured using the same. More particularly, the invention relates to a donor substrate used to form an organic layer for an organic electroluminescence display device, and an organic electroluminescence display device using the same.

2. Related Art

In general, an organic electroluminescence (EL) display device is composed of several layers, such as, for example, an anode, a cathode, a hole injecting layer, a hole transporting layer, an emission layer, an electron transporting layer, and an electron injecting layer. Organic electroluminescence display devices may be classified into polymer organic electroluminescence display devices and small molecule organic electroluminescence display devices according to the material used therein. In the case of the small molecule organic electroluminescence display device, each of the layers is formed by a vacuum deposition process; in the case of the polymer organic EL display device, the electroluminescent (EL) element may be manufactured by a spin coating process.

For monochrome devices, an organic electroluminescence display device using a polymer may be simply manufactured by a spin coating process, and needs a lower driving voltage compared to the device using small molecules, but it has disadvantages in efficiency and life span. Further, the manufacture of full color devices requires polymers of red, green and blue colors to be patterned, which leads to degradation of such luminescence characteristics as efficiency and life span when an inkjet technique or a laser-induced thermal imaging method is used for patterning.

In particular, when the laser-induced thermal imaging method is used for patterning, most single polymers are materials which are not transferred. A method of forming a pattern of a polymer organic electroluminescence display device using a laser-induced thermal imaging method is disclosed in Korean Patent No. 1998-51844, and also in U.S. Pat. Nos. 5,998,085, 6,214,520 and 6,114,088.

The application of the laser-induced thermal imaging method needs at least a light source, a transfer substrate, and a substrate, wherein light emitted from the light source is absorbed into a light absorption layer of the transfer layer and is converted to thermal energy. The thermal energy allows the material forming the transfer layer to be transferred onto the substrate so that a desired image is formed (see U.S. Pat. Nos. 5,220,348, 5,256,506, 5,278,023 and 5,308,737).

This laser-induced thermal imaging method has been used to manufacture a color filter for a liquid display device, and has also been used to form a pattern of an electroluminescent material (see U.S. Pat. No. 5,998,085).

The invention of U.S. Pat. No. 5,937,272 is directed to a method of forming an advanced patterned organic layer in a full-color organic electroluminescence display device. The method uses a donor support technique in which an organic electroluminescent material is coated with a transferable coating material. The donor support is heated so as to cause the organic electroluminescent material to be transferred onto a recessed surface of a substrate that forms a colored organic electroluminescent medium in an intended underlying pixel. At this time, heat or light is applied to the donor substrate so that the electroluminescent material is vaporized and transferred to the pixel.

In U.S. Pat. No. 5,688,551, a sub-pixel is formed in each pixel region by transfer from a donor sheet to a receiver sheet. In the transfer process, a sublimated organic electroluminescent material is transferred from the donor sheet to the receiver sheet at a low temperature (e.g., about 400° C. or less) so as to form the sub-pixel.

The polymer constituting the emission layer has a large molecular weight and thus the adhesion strength of the substrate becomes larger after laser transfer. Accordingly, the patterning by laser leads to poor transfer characteristics.

As a result, a shadow mask technique has been recently used for R, G and B patterning of the full-color organic electroluminescence display device. Thus, it would not be suitable for the patterning of a large-sized display device.

Recently, a polymer with a structure suitable for a photolithographic process was developed in order to manufacture a full-color organic electroluminescence display device by patterning red, greed and blue emission layers. However, in the latter method, because a photoacid generator is mixed to cure an exposed portion, impurities may be introduced, other active materials may be damaged by super acid generated upon curing, and the inflow of impurities may occur, all of which unreasonably affects the stability or life span of the device.

SUMMARY OF THE INVENTION

The present invention solves the aforementioned problems associated with conventional devices by providing a donor substrate for laser transfer and an organic electroluminescence display device manufactured using the same. The donor substrate contains a thermosetting polymer so that, when an emission layer is formed by a laser-induced thermal imaging method so as to manufacture the organic electroluminescence display device, an additional mask process is not required, other active materials are not damaged by super acid which is generated upon curing, and inflow of impurities does not occur.

In an exemplary embodiment of the present invention, a donor substrate for laser transfer includes: a base film; a light-to-heat conversion layer formed on the base film; and a transfer layer formed on the light-to-heat conversion layer, wherein the transfer layer contains a thermosetting electroluminescent material.

In another exemplary embodiment of the present invention, an organic electroluminescence display device manufactured using the donor substrate for laser transfer is provided.

In yet another exemplary embodiment of the present invention, a method for manufacturing a full-color organic electroluminescence display device comprises the steps of: providing a substrate; patterning and forming a first electrode layer on the substrate; forming an insulating layer on the first electrode layer so as to define first, second and third pixel regions; positioning a donor substrate containing a thermosetting material on the first pixel region; transferring a first electroluminescent material using laser; positioning a donor substrate containing a thermosetting material on the second pixel region; transferring a second electroluminescent material using the laser; positioning a donor substrate containing a thermosetting material on the third pixel region; transferring a third electroluminescent material using the laser; thermally curing the first, second and third electroluminescent materials to form first, second and third emission layers, respectively, in the first, second and third pixel regions, respectively; and forming a second electrode on the first, second and third emission layers over an entire surface of the substrate.

In yet another exemplary embodiment of the present invention, a full-color organic electroluminescence display device manufactured by the above method is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described in more detail with reference to the accompanying drawings.

Figure 1:
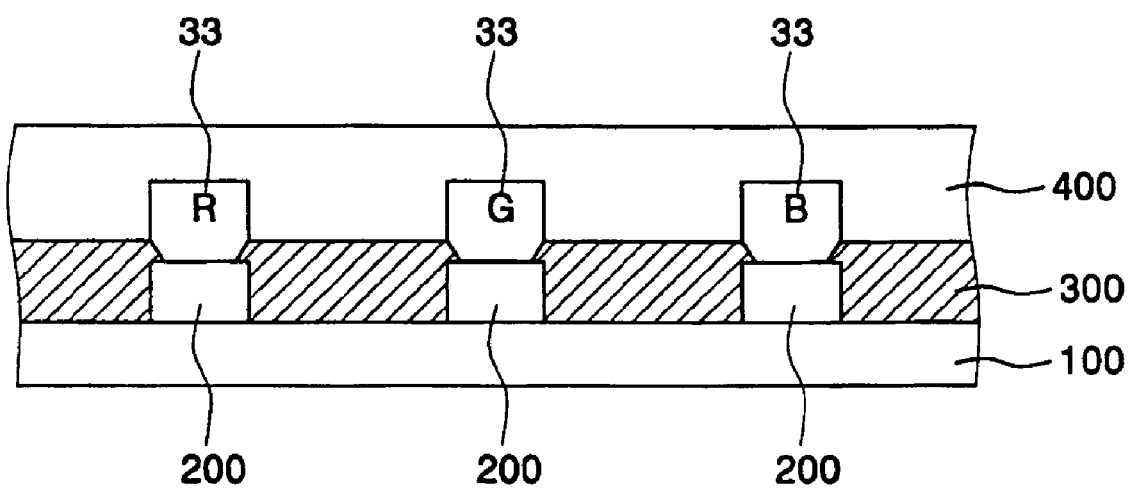
FIG. 1 is a cross-sectional view illustrating the structure of a full-color organic electroluminescence display device.

FIG. 1 is a cross-sectional view illustrating the structure of a full-color organic electroluminescence display device.

Referring to FIG. 1, a first electrode 200 is patterned and formed on an insulating substrate 100. For a bottom-emission display device, the first electrode 200 is formed of a transparent electrode. For a top-emission display device, the first electrode 200 is formed of a conductive metal including a reflective layer.

A pixel defining layer (PDL) 300 is formed of an insulating material on the first electrode 200 so as to define a pixel region and insulate the first electrode 200 from an emission layer.

An organic layer 330, which includes an organic emission layer, is formed in the pixel region defined by the pixel defining layer 300. The organic layer 330 may further include at least one of a hole injecting layer, a hole transporting layer, a hole blocking layer, an electron transporting layer, and an electron injecting layer, in addition to the organic emission layer. Both a polymer material and a small molecule material may be used for the organic emission layer.

A second electrode 400 is then formed on the organic layer 330. The second electrode 400 is formed of a conductive metal layer containing a reflective layer when the first electrode 200 is a transparent electrode. On the other hand, the second electrode 400 is formed of a transparent electrode when the first electrode 200 is a conductive metal layer including a reflective layer. The organic electroluminescence display device is then encapsulated to complete the organic electroluminescence display device.

Figure 2:
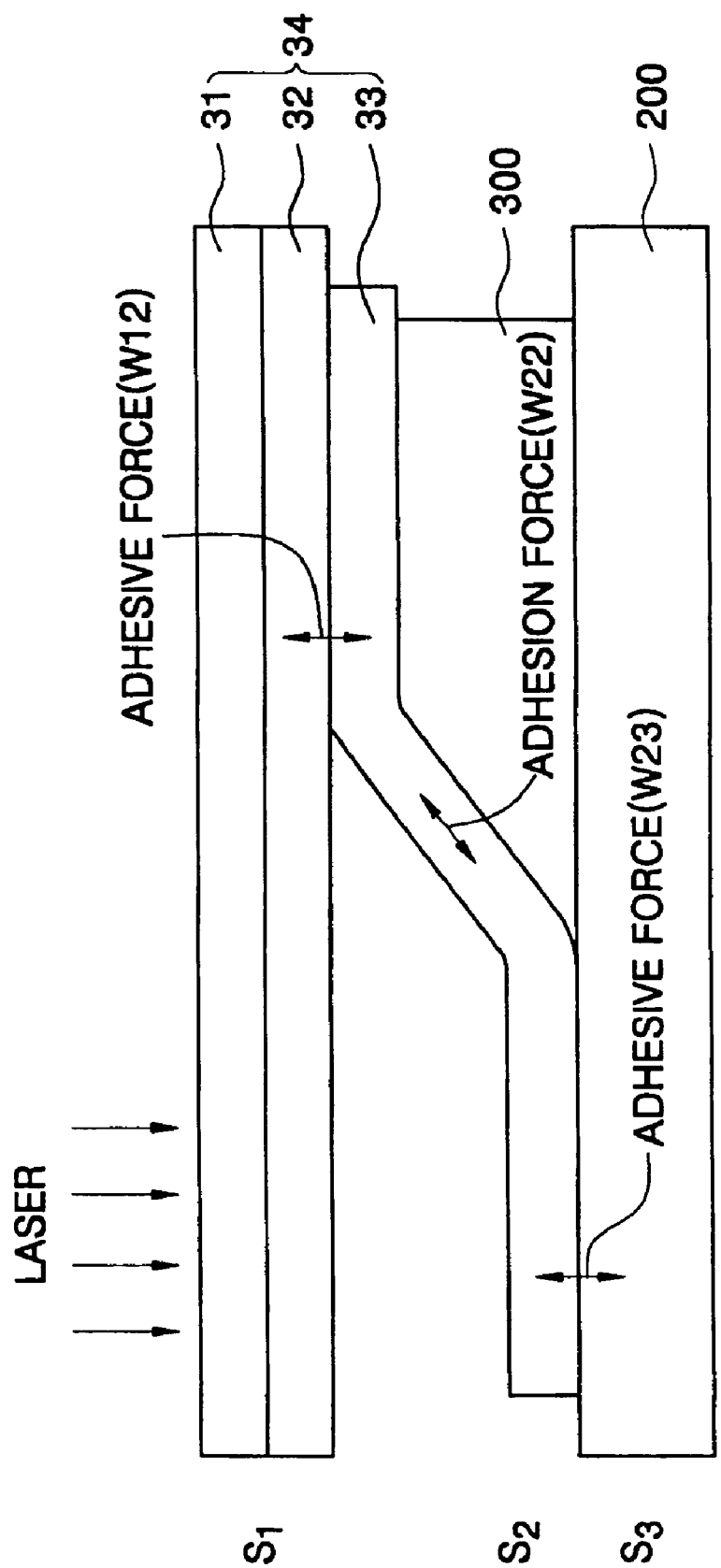
FIG. 2 is a diagram illustrating a transfer mechanism for transfer-patterning an organic emission layer for use in an organic electroluminescence display device using laser.

FIG. 2 is a diagram illustrating a transfer mechanism for transfer-patterning an organic emission layer for use in an organic electroluminescence display device using laser according to the present invention.

Typically, as shown in FIG. 2, the mechanism for transfer-patterning an organic layer 33 using a laser requires that an organic layer S2, which is adhered to a substrate S1, is separated from the substrate S1, and is then transferred onto a substrate S3 by irradiation of the laser, resulting in the separation of the organic layer S2 from a portion that is not irradiated by the laser.

Factors dominating the transfer characteristics include three of a first adhesive force W12 between the substrate S1 and the layer S2, an interlayer adhesion force W22 between the layers, and a second adhesive force W23 between the layer S2 and the substrate S3.

The following equation is obtained by representing the first and second adhesive forces and the interlayer adhesion force using surface tensions $\gamma1$, $\gamma2$ and $\gamma3$ and interface tensions $\gamma12$ and $\gamma23$ of the respective layers:

$$W12 = \gamma1 + \gamma2 - \gamma12$$

$$W22 = 2\gamma2$$

$$W23 = \gamma2 + \gamma3 - \gamma23$$

In order to enhance laser transfer characteristics, the interlayer adhesion force must be smaller than the adhesive forces between the substrates and the layer.

In general, in the organic electroluminescence display device, an organic material is used as a material forming each layer. In the case of using a small molecule material, it is possible to form a fine pattern of an emission layer by transferring an electroluminescent material 33 from a donor substrate 34 to the organic electroluminescence display device, wherein the transferring can cause a mass transition because the first and second adhesive forces are larger than the interlayer adhesion force. With such transfer, it is also possible to form the fine pattern of the emission layer and to minimize a possibility of misalignment.

Figure 3:
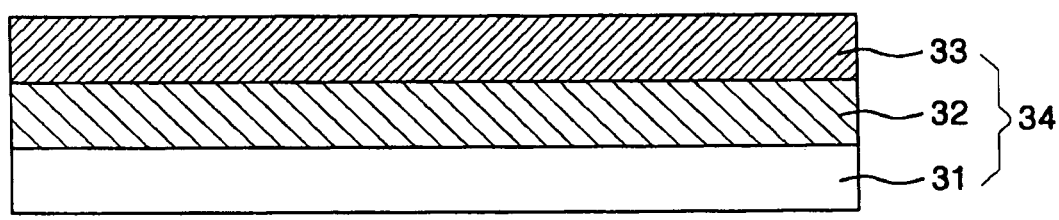
FIG. 3 is a diagram illustrating the structure of a donor substrate for laser transfer according to an embodiment of the present invention.

FIG. 3 is a diagram illustrating the structure of a donor substrate for laser transfer according to an embodiment of the present invention.

Referring to FIG. 3, the donor substrate 34 has a structure in which a base film 31, a light-to-heat conversion layer 32 formed on the base film 31, and a transfer layer 33 formed on the light-to-heat conversion layer 32 and over an entire surface of the base film 31 are stacked, wherein the transfer layer 33 is formed of an organic material.

The structure of the donor substrate 34 of FIG. 3 may be modified if necessary. For example, a gas-generating layer (not shown) may be formed beneath the light-to-heat conversion layer 32 to improve the sensitivity of the donor substrate. In addition, a buffer layer (not shown) may be formed to protect the light-to-heat conversion layer 32.

The base film 31 is formed of a layer which is composed of a glass or a transparent polymer. For example, as the polymer, polyether such as polyethylene terephthalate, polyacryl resin, polyepoxy, polyethylene, or polystyrene is used. In particular, polyethylene terephthalate film is primarily used. It is preferable that the base film 31 have a thickness of 10 to 500 μm. This base film 31 serves as a supporting layer. A complex multiple system may be used as the base film 31.

The light-to-heat conversion layer 32 is formed of a light absorption material which absorbs light in the infrared or visible range. A layer having such a characteristic includes a metal layer of aluminum, and oxide and sulphide thereof, and an organic layer of a polymer with carbon black, graphite, or infrared dye. The metal layer is formed to a thickness of 100 to 5,000 Å using a vacuum deposition method, an electron beam evaporation method, or a sputtering method. The organic layer is formed to a thickness of 0.1 to 10 μm using an extrusion method, a spin method, or a knife coating method, which is a typical film coating method.

The transfer layer 33 is formed on the light-to-heat conversion layer 32, and contains a thermosetting electroluminescent material.

The thermosetting electroluminescent material is an electroluminescent material capable of performing a curing reaction in the presence of heat. A thermosetting electroluminescent polymer containing a thermosetting functional group, or a blend of non-emission small molecules, which can be thermally cured, and an electroluminescent polymer containing no thermosetting functional group may be used as the thermosetting electroluminescent material.

The thermosetting electroluminescent polymer is one selected from the group consisting of an electroluminescent polymer containing, for example, a multiple combination capable of causing a curing reaction in a molecular structure, and an electroluminescent polymer containing a thermosetting functional group in a main chain or a side chain, or the thermosetting electroluminescent polymer is one selected from two or more blends thereof.

Specifically, the thermosetting electroluminescent polymer includes an oligomer, one polymer, or a blend of two or more selected from the group consisting of poly(penylenevinylene)(PPV), poly(p-phenylene) (PPP), polyfluorene (PF), poly(dialkylfluorene), polythiophene (PT), poly(9-vinylcarbazole), poly(N-vinylcarbazole-vinylalcohol) copolymer, triarylamine containing a silane group, polynorbornene containing triarylamine, polyaniline, polyaryl(polyamine), and triphenylamine-polyetherketone. As the thermosetting electroluminescent material, the above-stated electroluminescent material may be used alone or with a doped fluorescent or phosphorescent material.

The thermosetting electroluminescent polymer has a degree of cure of at least 60% in one hour at 50° C. to 350° C. It is preferable that the transfer layer contain a polymer of about 10 to 70% in view of the curing degree of the polymer.

Meanwhile, benzocyclobutene (BCB)-based small molecules having a double combination capable of performing a curing reaction, or dicyclopentadienone derivatives-diacethylene derivatives containing, for example, Dowcorning SiLK™, are used as the non-emission small molecule. This non-emission small molecule is blended with an electroluminescent polymer containing no thermosetting functional group. For the electroluminescent polymer containing no thermosetting functional group, any derivative of the electroluminescent polymer containing the thermosetting functional group may be used.

It is preferable that the electroluminescent polymer be contained in the transfer layer by 10 to 70% in view of the curing degree of the polymer.

It is preferable that the transfer layer 33 be formed on the light-to-heat conversion layer 32 by a wet process such as an extrusion method, a spin method, or a knife coating method.

Meanwhile, a gas-generating layer (not shown) serves to provide transfer energy by causing a decomposition reaction through light or heat absorption and by emitting, for example, a nitrogen gas or a hydrogen gas. The gas-generating layer is formed of a material selected from pentaerythritol tetranitrate (PETN), trinitrotoluene (TNT), and the like.

Furthermore, in order to conform to the characteristics of the organic electroluminescence display device to be manufactured, the transfer layer 33 is formed of at least one material selected from the group consisting of a polymer or small molecule organic electroluminescent material, a hole transporting organic material, and an electron transporting organic material.

For an organic electroluminescence display device in which an EL element is made of an organic material, it is possible to easily form a fine pattern of the donor substrate for laser transfer illustrated according to the present invention.

Hereinafter, a method of forming a fine pattern of an organic thin film for an organic electroluminescence display device using the donor substrate according to the present invention will be described in detail with reference to FIG. 4. For the sake of convenience of illustration, the organic electroluminescence display device will be hereinafter described as one application example of the donor substrate of the present invention. However, the donor substrate is not limited to application in the organic electroluminescence display device.

Figure 4:
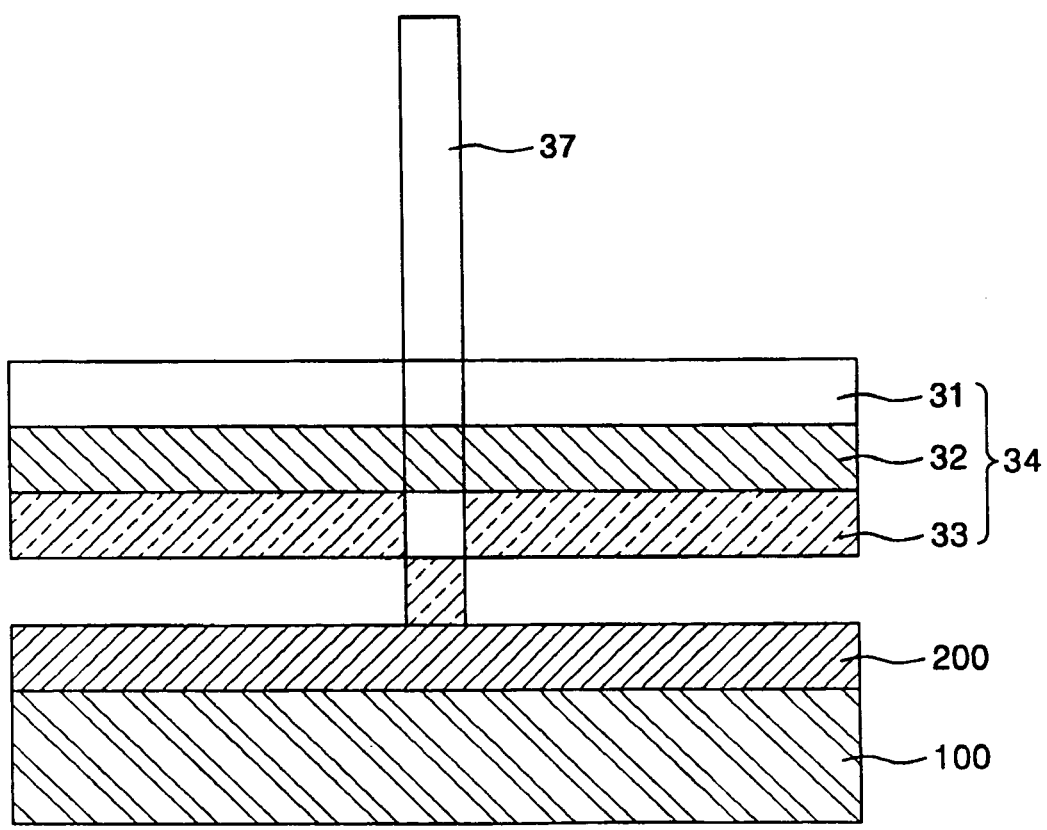
FIG. 4 is a diagram illustrating a method of manufacturing a full-color organic electroluminescence display device by laser transfer using a donor substrate according to the present invention.

FIG. 4 is a diagram illustrating a transfer method using a donor substrate according to the present invention. First, a transparent electrode layer 200 is formed on a transparent substrate 100. A light-to-heat conversion layer 32 and a transfer layer 33 are sequentially coated onto a base film 31 to separately prepare a donor substrate 34.

The transfer layer 33 is coated using a wet process in which an organic thin film containing a thermosetting electroluminescent material is formed. At this point, a predetermined amount of additive material maybe added to enhance several characteristics. For example, a dopant may be added to enhance efficiency of the emission layer. As described above, an extrusion method, a spin method, or a knife coating method, which is a typical film coating method, is used as the method for forming the transfer layer 33.

The transfer layer 33 may contain a thermosetting electroluminescent material capable of performing the curing reaction in the presence of heat, as described above. Such a material is a thermosetting electroluminescent polymer containing a thermosetting functional group, or a blend of a non-emission small molecule which can be thermally cured, or an electroluminescent polymer containing no thermosetting functional group. For the transfer layer 33, two or more layers may be stacked, as necessary.

The donor substrate 34 is then placed at a position spaced apart, by a predetermined interval, from a substrate 100 having a transparent electrode layer 200 patterned and formed, and thereafter the donor substrate 34 is irradiated by an energy source 37.

The energy source 37 passes through the base film 31 via a transfer device, and activates the light-to-heat conversion layer 32. It causes a thermal decomposition reaction in a light absorption material contained in the light-to-heat conversion layer 32, resulting in heat emission.

The emitted heat expands the light-to-heat conversion layer 32 of the donor substrate 34 so as to separate the transfer layer 33 from the donor substrate 34, and to transfer a first electroluminescent material, as a transfer material, onto a first pixel region R so as to have a desired pattern and thickness, wherein the first pixel region R (see FIG. 1) is defined by a pixel defining layer 300 on the substrate 100 of the organic electroluminescence display device.

The donor substrate containing a thermosetting material is then positioned on a second pixel region G, and a second electroluminescent material is transferred by the laser. Furthermore, the donor substrate containing a thermosetting electroluminescent material is positioned on a third pixel region B, and a third electroluminescent material is transferred by the laser.

Subsequently, the first, second and third electroluminescent materials are thermally cured to form first, second and third emission layers, respectively, in the first, second and third pixel regions, respectively.

The first, second, and third electroluminescent materials have different colors from each other and are any one of R, G and B colors. It is preferable that each transferring be performed in a vacuum or inert atmosphere.

Thus, the transfer layer contains the thermosetting polymer, such that an additional mask process is not required, other active materials are not damaged by super acid generated upon curing, and inflow of impurities does not occur. In addition, the number of masks used during the photolithographic process is reduced when the emission layer is conventionally formed by a photolithographic process.

The energy source used in the present invention may be, for example, a laser, a xenon (Xe) lamp, or a flash lamp. However, it is preferable to use the laser because it achieves an excellent transfer effect. For the laser, any general-purpose laser may be used. For example, a solid-state laser, a gas laser, a semiconductor laser, or a dye laser may be used. Furthermore, the laser beam may have a circular shape or other shape.

After the transfer process is thus performed, the transferred material is subjected to an annealing process for solidification and adherence.

The transfer of the transfer material is conducted in one step or in multiple steps. That is, the organic thin film to be transferred may be transferred to a necessary thickness in one step or by several repetitions. It is, however, preferable to transfer the transfer material in one step in view of the convenience and stability of the process.

As described above, according to the present invention, the thermosetting electroluminescent material is included in the transfer layer of the donor substrate for laser transfer, and R, G and B emission layers are simply formed with a fine pattern by a thermal curing process after laser transfer. As a result, the emission layers are not damaged, and the manufacturing cost of the full-color organic electroluminescence display device is reduced due to the simplified mask process employed. Furthermore, the donor substrate is advantageous when used to manufacture a large-sized organic electroluminescence display device.

Although the present invention has been described with reference to certain exemplary embodiments thereof, it will be understood by those skilled in the art that a variety of modifications and variations to the present invention may be made without departing from the spirit or scope of the present invention as defined in the appended claims and their equivalents.

What is claimed is:

1. A donor substrate for laser transfer, comprising:
   a base film;
   a light-to-heat conversion layer formed on the base film; and
   a transfer layer formed on the light-to-heat conversion layer, wherein the transfer layer contains a thermosetting electroluminescent material;
   wherein the thermosetting electroluminescent material comprises a composition which is used as a thermosetting electroluminescent material; and
   wherein the composition included in the thermosetting electroluminescent material comprises a blend of thermosetting non-emission small molecules and an electroluminescent polymer having no thermosetting functional group, and wherein the electroluminescent polymer is contained in the transfer layer to an extent of about 10% to 70%.

2. The donor substrate according to claim 1, wherein the thermosetting non-emission small molecules comprise one of a benzocyclobutene-based small molecule and dicyclopentadienone derivatives-diacethylene derivatives.

3. The donor substrate according to claim 1, wherein the transfer layer is formed on the light-to-heat conversion layer by a wet process.

4. An organic electroluminescence display device manufactured using the donor substrate for laser transfer as recited in claim 1.

5. A method for manufacturing a full-color organic electroluminescence display device, comprising the steps of:
   providing a substrate;
   patterning and forming a first electrode layer on the substrate;
   forming an insulating layer on the first electrode layer so as to define first, second and third pixel regions;
   positioning a donor substrate containing a thermosetting material on the first pixel region, and transferring a first electroluminescent material using a laser;
   positioning a donor substrate containing a thermosetting material on the second pixel region, and transferring a second electroluminescent material using the laser;
   positioning a donor substrate containing a thermosetting material on the third pixel region, and transferring a third electroluminescent material using the laser;
   thermally curing the first, second and third electroluminescent materials to form first, second and third emission layers, respectively, in the first, second and third pixel regions, respectively; and
   forming a second electrode on the first, second and third emission layers over an entire surface of the substrate;
   wherein the thermosetting electroluminescent material comprises a composition which includes a blend of thermosetting non-emission small molecules and an electroluminescent polymer having no thermosetting functional group, and wherein the electroluminescent polymer is contained in the transfer layer to an extent of about 10% to 70%.

6. The method according to claim 5, wherein each of the first, second and third electroluminescent materials has a different respective color and has one of red, green and blue colors.

7. The method according to claim 5, wherein each of the steps of transferring the first electroluminescent material, transferring the second electroluminescent material, and transferring the third electroluminescent material is performed in one of a vacuum and an inert atmosphere.

8. The method according to claim 5, wherein the thermosetting non-emission small molecules comprise one of a benzocyclobutene-based small molecule and dicyclopentadienone derivatives-diacethylene derivatives.

9. The method according to claim 5, wherein the thermosetting electroluminescent material ha a degree of cure of at least 60% when cured for one hour at a temperature in a range of 50° C. to 350° C.

10. A method of manufacturing a donor substrate for laser transfer, comprising the steps of:
    providing a base film;
    forming a light-to-heat conversion layer on the base film;

forming a transfer layer on the light-to-heat conversion layer, wherein the transfer layer contains a thermosetting electroluminescent material; and curing the thermosetting electroluminescent material for one hour at a temperature in a range of 50° C. to 350° C. so that the thermosetting electroluminescent material has a degree of cure of at least 60%.

11. A donor substrate for laser transfer manufactured by the method of claim 10.

12. An organic electroluminescent display device manufactured using a donor substrate for laser transfer manufactured by the method of claim 10.

* * * * *